United States Patent
Fazzio et al.

(10) Patent No.: US 7,479,685 B2
(45) Date of Patent: Jan. 20, 2009

(54) ELECTRONIC DEVICE ON SUBSTRATE WITH CAVITY AND MITIGATED PARASITIC LEAKAGE PATH

(75) Inventors: R. Shane Fazzio, Loveland, CO (US); Richard C. Ruby, Menlo Park, CA (US); Christopher P. Wade, Los Gatos, CA (US); Michael Louis Frank, Menlo Park, CA (US); David A. Feld, Newark, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 37 days.

(21) Appl. No.: 11/373,434

(22) Filed: Mar. 10, 2006

(65) Prior Publication Data

US 2007/0236310 A1  Oct. 11, 2007

(51) Int. Cl.
*H01L 29/78* (2006.01)

(52) U.S. Cl. .............. 257/416; 257/245; 333/187; 310/311; 310/324; 310/348

(58) Field of Classification Search .......... 257/416, 257/245; 333/187; 310/311, 324, 348
See application file for complete search history.

(56) References Cited

U.S. PATENT DOCUMENTS

| | | | |
|---|---|---|---|
| 3,174,122 A | 3/1965 | Fowler et al. | |
| 3,189,851 A | 6/1965 | Fowler | |
| 3,321,648 A | 5/1967 | Kolm | |
| 3,422,371 A | 1/1969 | Poirier et al. | |
| 3,568,108 A | 3/1971 | Poirier et al. | |
| 3,582,839 A | 6/1971 | Pim et al. | |
| 3,590,287 A | 6/1971 | Berlincourt et al. | |
| 3,610,969 A | 10/1971 | Clawson et al. | |
| 3,826,931 A | 7/1974 | Hammond | |
| 3,845,402 A | 10/1974 | Nupp | |
| 4,084,217 A | 4/1978 | Brandis et al. | |
| 4,172,277 A | 10/1979 | Pinson | |
| 4,272,742 A | 6/1981 | Lewis | |
| 4,281,299 A | 7/1981 | Newbold | |
| 4,320,365 A | 3/1982 | Black et al. | |
| 4,355,408 A | 10/1982 | Scarrott | |
| 4,456,850 A | 6/1984 | Inoue et al. | |

(Continued)

FOREIGN PATENT DOCUMENTS

DE  10160617  6/2003

(Continued)

OTHER PUBLICATIONS

U.S. Appl. No. 11/971,169, filed Oct. 22, 2004, Larson III, John D., et al.

(Continued)

*Primary Examiner*—Evan Pert
*Assistant Examiner*—Tan N Tran

(57) ABSTRACT

An electronic device. The electronic device includes a first electrode and a coating layer. The electronic device is fabricated on a substrate; the substrate has a cavity created in a top surface of the substrate; and the first electrode is electrically coupled to the substrate. The coating layer coats at least part of a substrate surface in the cavity, and the presence of the coating layer results in a mitigation of at least one parasitic leakage path between the first electrode and an additional electrode fabricated on the substrate.

7 Claims, 12 Drawing Sheets

U.S. PATENT DOCUMENTS

| | | | |
|---|---|---|---|
| 4,529,904 A | 7/1985 | Hattersley | |
| 4,625,138 A | 11/1986 | Ballato | |
| 4,640,756 A | 2/1987 | Wang et al. | |
| 4,719,383 A | 1/1988 | Wang et al. | |
| 4,798,990 A | 1/1989 | Henoch | |
| 4,836,882 A | 6/1989 | Ballato | |
| 4,841,429 A | 6/1989 | Mcclanahan et al. | |
| 4,906,840 A | 3/1990 | Zdeblick et al. | |
| 5,048,036 A | 9/1991 | Scifres et al. | |
| 5,048,038 A | 9/1991 | Brennan et al. | |
| 5,075,641 A | 12/1991 | Weber et al. | |
| 5,118,982 A | 6/1992 | Inoue et al. | |
| 5,129,132 A | 7/1992 | Zdeblick et al. | |
| 5,162,691 A | 11/1992 | Mariani et al. | |
| 5,241,209 A | 8/1993 | Sasaki | |
| 5,241,456 A | 8/1993 | Marcinkiewicz et al. | |
| 5,294,898 A | 3/1994 | Dworsky et al. | |
| 5,361,077 A | 11/1994 | Weber | |
| 5,382,930 A | 1/1995 | Stokes et al. | |
| 5,384,808 A | 1/1995 | Van Brunt et al. | |
| 5,448,014 A | 9/1995 | Kong et al. | |
| 5,465,725 A | 11/1995 | Seyed-Bolorforosh | |
| 5,587,620 A | 12/1996 | Ruby et al. | |
| 5,589,858 A | 12/1996 | Kadowaki et al. | |
| 5,594,705 A | 1/1997 | Connor et al. | |
| 5,671,242 A | 9/1997 | Takiguchi et al. | |
| 5,692,279 A | 12/1997 | Mang et al. | |
| 5,705,877 A | 1/1998 | Shimada | |
| 5,714,917 A | 2/1998 | Ella | |
| 5,853,601 A | 12/1998 | Krishaswamy et al. | |
| 5,864,261 A | 1/1999 | Weber | |
| 5,866,969 A | 2/1999 | Shimada et al. | |
| 5,872,493 A | 2/1999 | Ella | |
| 5,873,153 A | 2/1999 | Ruby et al. | |
| 5,873,154 A | 2/1999 | Ylilammi et al. | |
| 5,894,184 A | 4/1999 | Furuhashi et al. | |
| 5,894,647 A | 4/1999 | Lakin | |
| 5,910,756 A | 6/1999 | Ella | |
| 5,932,953 A | 8/1999 | Drees et al. | |
| 5,936,150 A | 8/1999 | Kobrin et al. | |
| 5,953,479 A | 9/1999 | Zhou et al. | |
| 5,982,297 A | 11/1999 | Welle | |
| 6,040,962 A | 3/2000 | Kanazawa | |
| 6,060,818 A | 5/2000 | Ruby et al. | |
| 6,087,198 A | 7/2000 | Panasik | |
| 6,107,721 A | 8/2000 | Lakin | |
| 6,111,480 A | 8/2000 | Iyama et al. | |
| 6,124,756 A | 9/2000 | Yaklin et al. | |
| 6,150,703 A | 11/2000 | Cushman et al. | |
| 6,187,513 B1 | 2/2001 | Katakura | |
| 6,215,375 B1 | 4/2001 | Larson, III et al. | |
| 6,228,675 B1 | 5/2001 | Ruby et al. | |
| 6,229,247 B1 | 5/2001 | Bishop | |
| 6,252,229 B1 | 6/2001 | Hays et al. | |
| 6,262,600 B1 | 7/2001 | Haigh et al. | |
| 6,262,637 B1 | 7/2001 | Bradley et al. | |
| 6,265,246 B1 | 7/2001 | Ruby et al. | |
| 6,278,342 B1 | 8/2001 | Ella | |
| 6,292,336 B1 | 9/2001 | Horng | |
| 6,307,447 B1 | 10/2001 | Barber et al. | |
| 6,307,761 B1 | 10/2001 | Nakagawa | |
| 6,366,006 B1 | 4/2002 | Boyd | |
| 6,376,280 B1 | 4/2002 | Ruby et al. | |
| 6,377,137 B1 | 4/2002 | Ruby | |
| 6,384,697 B1 * | 5/2002 | Ruby | 333/189 |
| 6,407,649 B1 | 6/2002 | Tikka et al. | |
| 6,414,569 B1 | 7/2002 | Nakafuku | |
| 6,420,820 B1 | 7/2002 | Larson, III | |
| 6,424,237 B1 | 7/2002 | Ruby et al. | |
| 6,429,511 B2 | 8/2002 | Ruby et al. | |
| 6,434,030 B1 | 8/2002 | Rehm et al. | |
| 6,437,482 B1 | 8/2002 | Shibata | |
| 6,441,539 B1 | 8/2002 | Kitamura et al. | |
| 6,462,631 B2 | 10/2002 | Bradley et al. | |
| 6,466,105 B1 | 10/2002 | Lobl et al. | |
| 6,466,418 B1 | 10/2002 | Horng | |
| 6,469,597 B2 | 10/2002 | Ruby et al. | |
| 6,472,954 B1 | 10/2002 | Ruby et al. | |
| 6,476,536 B1 | 11/2002 | Pensala | |
| 6,479,320 B1 | 11/2002 | Gooch | |
| 6,483,229 B2 | 11/2002 | Larson, III et al. | |
| 6,486,751 B1 | 11/2002 | Barber et al. | |
| 6,489,688 B1 | 12/2002 | Baumann et al. | |
| 6,492,883 B2 | 12/2002 | Liang et al. | |
| 6,507,983 B1 | 1/2003 | Ruby et al. | |
| 6,515,558 B1 | 2/2003 | Ylilammi | |
| 6,518,860 B2 | 2/2003 | Ella et al. | |
| 6,525,996 B1 | 2/2003 | Miyazawa | |
| 6,530,515 B1 | 3/2003 | Glenn et al. | |
| 6,534,900 B2 | 3/2003 | Aigner et al. | |
| 6,542,055 B1 | 4/2003 | Frank et al. | |
| 6,548,942 B1 | 4/2003 | Panaski | |
| 6,550,664 B2 | 4/2003 | Bradley et al. | |
| 6,564,448 B1 | 5/2003 | Oura et al. | |
| 6,566,979 B2 | 5/2003 | Larson et al. | |
| 6,583,374 B2 | 6/2003 | Knieser et al. | |
| 6,583,688 B2 | 6/2003 | Klee et al. | |
| 6,593,870 B2 | 7/2003 | Dummermuth et al. | |
| 6,600,390 B2 | 7/2003 | Frank | |
| 6,601,276 B2 | 8/2003 | Barber | |
| 6,617,249 B2 | 9/2003 | Ruby et al. | |
| 6,617,750 B2 | 9/2003 | Dummermuth et al. | |
| 6,630,753 B2 | 10/2003 | Malik et al. | |
| 6,635,509 B1 | 10/2003 | Ouellet | |
| 6,639,872 B1 | 10/2003 | Rein | |
| 6,651,488 B2 | 11/2003 | Larson et al. | |
| 6,657,363 B1 | 12/2003 | Aigner | |
| 6,668,618 B2 | 12/2003 | Larson et al. | |
| 6,670,866 B2 | 12/2003 | Ella et al. | |
| 6,693,500 B2 | 2/2004 | Yang et al. | |
| 6,710,508 B2 | 3/2004 | Ruby et al. | |
| 6,710,681 B2 | 3/2004 | Figueredo et al. | |
| 6,714,102 B2 | 3/2004 | Ruby et al. | |
| 6,720,844 B1 | 4/2004 | Lakin | |
| 6,720,846 B2 | 4/2004 | Iwashita et al. | |
| 6,724,266 B2 | 4/2004 | Plazza et al. | |
| 6,774,746 B2 | 8/2004 | Whatmore et al. | |
| 6,777,263 B1 | 8/2004 | Gan et al. | |
| 6,787,048 B2 | 9/2004 | Bradley et al. | |
| 6,788,170 B1 | 9/2004 | Kaitila et al. | |
| 6,803,835 B2 | 10/2004 | Frank | |
| 6,812,619 B1 | 11/2004 | Kaitila et al. | |
| 6,828,713 B2 | 12/2004 | Bradley et al. | |
| 6,842,088 B2 | 1/2005 | Yamada et al. | |
| 6,873,065 B2 | 3/2005 | Haigh et al. | |
| 6,873,529 B2 | 3/2005 | Ikuta | |
| 6,874,211 B2 | 4/2005 | Bradley et al. | |
| 6,874,212 B2 | 4/2005 | Larson, III | |
| 6,888,424 B2 | 5/2005 | Takeuchi et al. | |
| 6,900,705 B2 | 5/2005 | Nakamura et al. | |
| 6,903,452 B2 | 6/2005 | Ma et al. | |
| 6,906,451 B2 | 6/2005 | Yamada | |
| 6,911,708 B2 | 6/2005 | Park | |
| 6,917,261 B2 | 7/2005 | Unterberger | |
| 6,924,583 B2 | 8/2005 | Lin et al. | |
| 6,924,717 B2 | 8/2005 | Ginsburg et al. | |
| 6,927,651 B2 | 8/2005 | Larson, III et al. | |
| 6,936,928 B2 | 8/2005 | Hedler et al. | |
| 6,936,954 B2 | 8/2005 | Peczalski | |
| 6,946,928 B2 | 9/2005 | Larson et al. | |
| 6,954,121 B2 | 10/2005 | Bradley et al. | |
| 6,963,257 B2 | 11/2005 | Ella et al. | |
| 6,970,365 B2 | 11/2005 | Turchi | |
| 6,975,183 B2 | 12/2005 | Aigner et al. | |

| | | |
|---|---|---|
| 6,977,563 B2 | 12/2005 | Komuro et al. |
| 6,985,052 B2 | 1/2006 | Tikka |
| 6,987,433 B2 | 1/2006 | Larson et al. |
| 6,989,723 B2 | 1/2006 | Komuro et al. |
| 6,998,940 B2 | 2/2006 | Metzger |
| 7,019,604 B2 | 3/2006 | Gotoh et al. |
| 7,019,605 B2 | 3/2006 | Larson et al. |
| 7,057,476 B2 | 6/2006 | Hwu |
| 7,084,553 B2 | 8/2006 | Ludwiczak |
| 7,091,649 B2 | 8/2006 | Larson |
| 7,098,758 B2 | 8/2006 | Wang et al. |
| 7,170,215 B2 | 1/2007 | Namba et al. |
| 7,173,504 B2 | 2/2007 | Larson |
| 7,187,254 B2 | 3/2007 | Su et al. |
| 7,230,509 B2 | 6/2007 | Stoemmer |
| 7,281,304 B2 * | 10/2007 | Kim et al. .................. 29/25.35 |
| 2002/0000646 A1 | 1/2002 | Gooch et al. |
| 2002/0030424 A1 | 3/2002 | Iwata |
| 2002/0121944 A1 | 9/2002 | Larson, III et al. |
| 2002/0121945 A1 | 9/2002 | Ruby et al. |
| 2002/0152803 A1 | 10/2002 | Larson, III et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0141946 A1 | 7/2003 | Ruby et al. |
| 2003/0179053 A1 | 9/2003 | Aigner et al. |
| 2004/0092234 A1 | 5/2004 | Pohjonen |
| 2004/0124952 A1 | 7/2004 | Tikka |
| 2004/0150293 A1 | 8/2004 | Unterberger |
| 2004/0150296 A1 | 8/2004 | Park et al. |
| 2004/0195937 A1 | 10/2004 | Matsubara et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson et al. |
| 2005/0093653 A1 | 5/2005 | Larson, III |
| 2005/0093654 A1 | 5/2005 | Larson et al. |
| 2005/0093655 A1 | 5/2005 | Larson et al. |
| 2005/0093657 A1 | 5/2005 | Larson et al. |
| 2005/0093658 A1 | 5/2005 | Larson et al. |
| 2005/0093659 A1 | 5/2005 | Larson et al. |
| 2005/0104690 A1 | 5/2005 | Larson |
| 2005/0110598 A1 | 5/2005 | Larson, III |
| 2005/0128030 A1 | 6/2005 | Larson et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0218488 A1 | 10/2005 | Mie |
| 2006/0087199 A1 | 4/2006 | Larson et al. |
| 2006/0103492 A1 | 5/2006 | Feng et al. |
| 2006/0125489 A1 | 6/2006 | Feucht et al. |
| 2006/0132262 A1 | 6/2006 | Fazzlo et al. |
| 2006/0164183 A1 | 7/2006 | Tikka |
| 2006/0185139 A1 | 8/2006 | Larson, III et al. |
| 2006/0197411 A1 | 9/2006 | Hoen et al. |
| 2006/0238070 A1 | 10/2006 | Costa et al. |
| 2007/0084964 A1 | 4/2007 | John et al. |
| 2007/0085447 A1 | 4/2007 | Larson |
| 2007/0085631 A1 | 4/2007 | Larson et al. |
| 2007/0085632 A1 | 4/2007 | Larson et al. |
| 2007/0086080 A1 | 4/2007 | Larson et al. |
| 2007/0086274 A1 | 4/2007 | Nishimura et al. |
| 2007/0090892 A1 | 4/2007 | Larson |
| 2007/0170815 A1 | 7/2007 | Unkrich |
| 2007/0171002 A1 | 7/2007 | Unkrich |

FOREIGN PATENT DOCUMENTS

| | | |
|---|---|---|
| EP | 0231892 | 8/1987 |
| EP | 0637875 | 2/1995 |
| EP | 0689254 | 6/1995 |
| EP | 0865157 | 9/1998 |
| EP | 0880227 | 11/1998 |
| EP | 0973256 | 1/2000 |
| EP | 1047189 | 10/2000 |
| EP | 1096259 | 5/2001 |
| EP | 1100196 | 5/2001 |
| EP | 1258990 | 11/2002 |
| EP | 1180494 | 3/2003 |
| EP | 1542362 | 6/2003 |
| EP | 1258989 | 1/2004 |
| EP | 1249932 | 3/2005 |
| EP | 1517443 | 3/2005 |
| EP | 1517444 | 3/2005 |
| EP | 1528674 | 5/2005 |
| EP | 1528675 | 5/2005 |
| EP | 1528677 | 5/2005 |
| EP | 1557945 | 7/2005 |
| EP | 1575165 | 9/2005 |
| GB | 1207974 | 10/1970 |
| GB | 2411239 | 8/2005 |
| GB | 2418791 | 4/2006 |
| JP | 61054686 | 3/1986 |
| JP | 2002/217676 | 8/2002 |
| WO | WO-98/16957 | 4/1998 |
| WO | WO-01/06647 | 1/2001 |
| WO | WO-01/99276 | 12/2001 |
| WO | WO-02/103900 | 12/2002 |
| WO | WO-03/030358 | 4/2003 |
| WO | WO-03/043188 | 5/2003 |
| WO | WO-03/050950 | 6/2003 |
| WO | WO-03/058809 | 7/2003 |
| WO | WO-2004/034579 | 4/2004 |
| WO | WO-2004/051744 | 6/2004 |
| WO | WO-2005/043752 | 5/2005 |
| WO | WO-2005/043753 | 5/2005 |
| WO | WO-2005/043756 | 5/2005 |
| WO | WO 2006/018788 | 2/2006 |

OTHER PUBLICATIONS

Holzlohner, Ronald et al., "Accurate Calculation of Eye Diagrams and Bit Error Rates in Optical Transmission Systems Using Linearization", *Journal of Lightwave Technology*, vol. 20, No. 3,, (Mar. 2002),pp. 389-400.

Reinhardt, Alexandre et al., "Design of Coupled Resonator Filters Using Admittance and Scattering Matrices", *2003 IEEE Ultrasonics Symposium*, (May 3, 2003),1428-1431.

"Search Report for Great Britain Patent Application", No. 0617742. 2, (Dec. 13, 2006).

"Search Report in the Great Britian Patent Application", No. 0619698.4, (Nov. 30, 2006).

Ruby, R. et al., "The Effect of Perimeter Geometry on FBAR Resonator Electrical Performance", *Microwave Symposium Digest, 2005 IEEE MTT-S International*, (Jun. 12, 2005),217-221.

Schuessler, Hans H., "Ceramic Filters and Resonators", *Reprinted from IEEE Trans. Sonics Ultrason.*, vol. SU-21, (Oct. 1974),257-268.

Fattinger, G. G., et al., "Coupled Bulk Acoustic Wave Resonator Filters: Key technology for single-to-balanced RF filters", 0-7803-8331-1/4/W20.00; *IEEE MTT-S Digest*, (2004),927-929.

Larson III, J. D., et al., "Measurement of Effective Kt2q,RpRs vs. Temperature for Mo/AIN/Mo Resonators", *2002 IEEE Ultrasonics Symposium*, Munich, Germany, (Oct. 2002),915-919.

Ruby, R. C., "Micro-Machined Thin Film Bulk Acoustic Resonators", *Proc. IEEE 48th, Symposium on Frequency control*, (1994), 135-138.

Aoyama, T. et al., "Diffusion of Boron, Phosphorous, Arsenic and Antimony in Thermally Grown SiliconDioxide", *Fiujitsu Labs, J. Electromechanical Soc.*, vol. 146, No. 5, (1999),1879-1883.

Park, T. E., et al., "Temperature-Compensated Surface Acoustic-Wave Devices with SiO2 Film Overlays", *J. Appl. Physics*, vol. 50, (1360-1369),Mar. 1979.

Tsubbouchi, K. et al., "Zero Temperature coefficient Surface Acoustic Wave Devices using Epitaxial AIN Films", *IEEE Ultrasonic symposium*, San Diaego, CA, 1082, (1982),240-245.

Lakin, K. M., "Thin Film Resonators and Filters", *IEEE Untrasonics Symposium*, Caesar's Tahoe, NV, (Oct. 1999),895-906.

Lakin, K. M., et al., "Temperature Compensated Bulk Acoustic Thin Film Resonators", *IEEE Ultrasonics Symposium*, San Juan, Puerto Rico, (Oct. 2000),855-858.

Ohta, S. et al., "Temperature Characteristics of Solidly Mounted Piezoelectric Thin Film Resonators", *IEEE Ultrasonics Symposium*, Honolulu, HI, (Oct. 2003),2011-2015.

Li, Yunxiu et al., "AC-DC Converter with Worldwide Range Input Voltage by Series and Parallel Piezoelectric Transformer Connection", *35th Annual IEEE Power Electronics Specialists Conference*, (2004).

Choi, Sungjin et al., "Design of Half-Bridge Piezo-Transformer Converters in the AC Adapter Applications", *IEEE 2005*, 244-248.

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

Navas, J. et al., "Miniaturised Battery Charger using Piezoelectric Transformers", *IEEE*, (2001),492-496.

Jiang, Yimin et al., "A Novel Single-Phase Power Factor Correction Scheme", *IEEE*, (1993),287-292.

Bauer, L. O., et al., "Properties of Silicon Implanted with Boron Ions through Thermal Silicon Dioxide", *Solid State Electronics*, vol. 16, No. 3, (Mar. 1973),289-300.

Topich, J. A., et al., "Effects of Ion Implanted Flourine in Silicon Dioxide", *Nuclear Instr. And Methods, Cecon Rec*, Cleveland, OH, (May 1978),70-73.

Spangenberg, B. et al., "Dependence of the Layer Resistance of Boron Implantation in Silicon and the Annealing Conditions", *Comptus Rendus de l'Academic Bulgare des Sciences*, vol. 33, No. 3, (1980),325-327.

Hara, K. "Surface Treatment of Quartz Oscillator Plate by Ion Implantation", *Oyo Buturi*, vol. 47, No. 2, (Feb. 1978),145-146.

Ng, J. et al., "The Diffusion Ion-Implanted Boron in Silicon Dioxide", *AIP Conf. Proceedings*, No. 122, (1984),20-33.

Pang, W. et al., "High Q Single-Mode High-Tone Bulk Acoustic Resonator Integrated With Surface-Machined FBAR Filter", *Microwave Symposium Digest, IEEE MTT-S International*, (2005),413-416.

Hadimioglu, B. et al., ""Polymer Films As Acoustic Matching Layers".", *1990 IEEE Ultrasonics Symposium Proceedings*, vol. 3 pp., Previously submitted as "Polymer Files As Acoustic Matching Layers, 1990 IEEE Ultrasonics Symposium Proceeding. vol. 4 pp. 1227-1340, Dec. 1990". Considered by Examiner on Mar. 20, 2007,(Dec. 1990), 1337-1340.

Lakin, K.M. "Coupled Resonator Filters", *2002 IEEE Ultrasonics Symposium*, (Mar. 2, 2002),901-908.

Lakin, K.M. et al., "High Performance Stacked Crystal Filters for GPS and Wide Bandwidth Applications", *2001 IEEE Ultrasonics Symposium*, (Jan. 1, 2001),833-838.

Krishnaswamy, S.V. et al., "Film Bulk Acoustic Wave Resonator Technology", (May 29, 1990),529-536.

Lobl, H.P. et al., "Piezoelectric Materials For BAW Resonators And Filters", *2001 IEEE Ultrasonics Symposium*, (Jan. 1, 2001),807-811.

Lakin, K.M. "Bulk Acoustic Wave Coupled Resonator Filters", *2002 IEEE International Frequency Control Symposium and PDA Exhibition*, (Jan. 2, 2002),8-14.

Jung, Jun-Phil et al., "Experimental And Theoretical Investigation On The Relationship Between AIN Properties And AIN-Based FBAR Characteristics", *2003 IEEE International Frequency Control Symposium and PDA Exhibition Jointly with the 17th European Frequency and Time Forum*, (Sep. 3, 2003),779-784.

Yang, C.M. et al., "Highly C Axis Oriented AIN Film Using MOCVD For 5GHx Band FBAR Filter", *2003 IEEE Ultrasonics Symposium*, (Oct. 5, 2003),pp. 170-173.

Martin, Steven J., et al., "Development Of A Low Dielectric Constant Polymer For The Fabrication Of Integrated Circuit Interconnect", *12 Advanced Materials*, (Dec. 23, 2000),1769-1778.

"Examination Report from UK for application", *GB 0605971.1*, (Aug. 24, 2006).

"Search Report from corresponding application number", *GB 0605779.8*, (Aug. 23, 2006).

"Examination report corresponding to application no.", *GB0605770.7*, (Aug. 25, 2006).

"Search report from corresponding application No.", *GB0620655.1*, (Nov. 17, 2006).

"Search report from corresponding application No.", *GB0620152.9*, (Nov. 15, 2006).

Coombs, Clyde F., et al., "Electronic Instrument Handbook", *Second Edition, McGraw-Hill, Inc.*, (1995),pp. 5.1 to 5.29.

"Search report from corresponding application No.", *GB0620653.6*, (Nov. 17, 2006).

"Search Report from corresponding application No.", *GB0620657.7*, (Nov. 23, 2006).

"A partial copy of GB Search Report for", *Application No. GB0522393.8*, (Jan. 9, 2006),4 pages.

"British Search Report Application No.", *0605222.9*, (Jul. 11, 2006).

"A partial copy of GB Search Report for Application No.", *GB0525884.3*, (Feb. 2, 2006),4 pgs.

Auld, B. A., "Acoustic Resonators", *Acoustic Fields and Waves in Solids, Second Edition*, vol. II, (1990),250-259.

Tiersten, H. F., et al., "An Analysis of Thiskness-Extensional Trapped Energy Resonant Device Structure with Rectangular Electrodes in the Piezoelectric Thin Film on Silicon Configuration", *J. Appl. Phys. 54* (10), (Oct. 1983),5893-5910.

"Search Report from corresponding application", *No. GB0605225.2*, (Jun. 26, 2006).

"Search Report for Great Britain Patent Application", *No. 0617742.2*, (Mar. 29, 2007).

\* cited by examiner

ELECTRONIC DEVICE ON SUBSTRATE WITH CAVITY AND MITIGATED PARASITIC LEAKAGE PATH

BACKGROUND

Parasitic leakage effects in electronic circuits and devices can result in unwanted and often detrimental spurious signals. Modern devices have become more and more sophisticated with the associated requirement for improved performance with respect to parasitic effects, as well as other performance characteristics, in amplifier and receiver circuits used, for example, in microwave and radio frequency (RF) applications.

RF filter devices built on semiconductor substrates, such as film-bulk acoustic resonators (FBARs), can be susceptible to leakage effects between traces and pads, especially between input and output pads due to intimate connection between the pads and the underlying semiconductor. FBARs manufactured in the manner of an acoustic resonator suspended over a cavity are also susceptible to leakage paths along the floor and walls of the cavity. Extraneous conduction paths can result in multiple deleterious effects, such as poor passband performance. Different types of conduction paths may exist, for example, substrate and surface conduction paths.

SUMMARY

In a representative embodiment, an electronic device is disclosed. The electronic device comprises a first electrode and a coating layer. The electronic device is fabricated on a substrate; the substrate has a cavity created in a top surface of the substrate; and the first electrode is electrically coupled to the substrate. The coating layer coats at least part of a substrate surface in the cavity, and the presence of the coating layer results in a mitigation of at least one parasitic leakage path between the first electrode and an additional electrode fabricated on the substrate.

In another representative embodiment, a thin film bulk acoustic resonator is disclosed. The thin film bulk acoustic resonator comprises a first electrode, a piezoelectric layer overlying at least part of the first electrode, a second electrode overlying at least part of the piezoelectric layer, and a coating layer. The thin film bulk acoustic resonator is fabricated on a substrate; the substrate has a cavity created in a top surface of the substrate; and the coating layer coats at least part of a substrate surface in the cavity.

In still another representative embodiment, an electronic module is disclosed. The electronic module comprises a plurality of electronic devices constructed on a substrate. The substrate has at least one cavity created in a top surface of the substrate; at least part of at least one cavity is coated with a coating layer; and the presence of the coating layer results in a mitigation of at least one parasitic leakage path on the substrate.

In yet another representative embodiment, a method for fabricating an electronic device is disclosed. The method comprises creating a cavity in a top surface of a substrate, creating a coating layer overlying at least part of substrate surface in the cavity, filling the cavity with a sacrificial material, and creating a first electrode. The first electrode is electrically coupled to the substrate, and the presence of the coating layer results in a mitigation of at least one parasitic leakage path between the first electrode and an additional electrode fabricated on the substrate.

Other aspects and advantages of the representative embodiments presented herein will become apparent from the following detailed description, taken in conjunction with the accompanying drawings.

BRIEF DESCRIPTION OF THE DRAWINGS

The accompanying drawings provide visual representations which will be used to more fully describe various representative embodiments and can be used by those skilled in the art to better understand them and their inherent advantages. In these drawings, like reference numerals identify corresponding elements.

DETAILED DESCRIPTION

Figure 1:
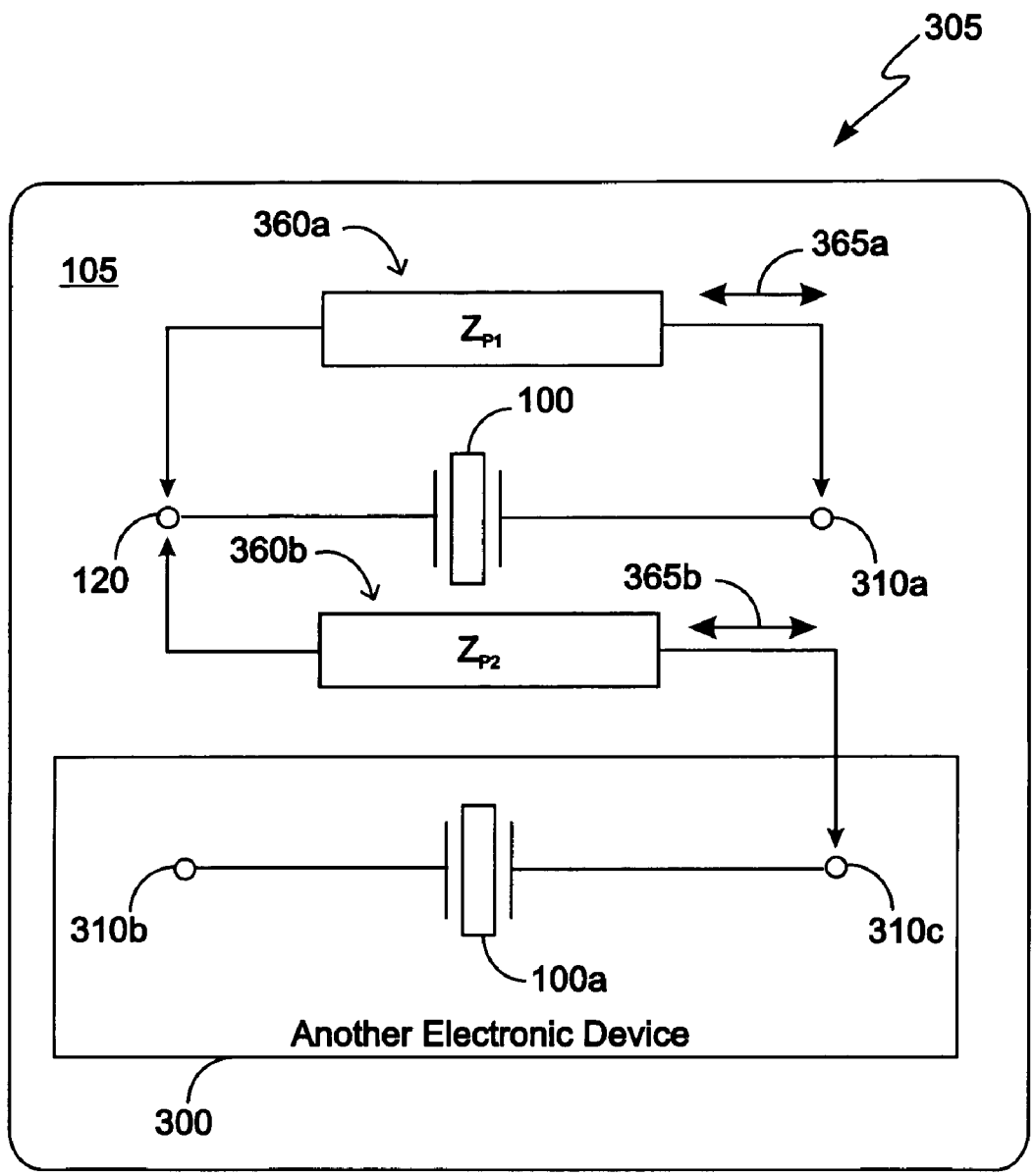
FIG. 1 is a drawing of a block diagram of an electronic module.

As shown in the drawings for purposes of illustration, novel electronic devices are disclosed herein which have reduced susceptibility to spurious signals including those from leakage effects. In representative embodiments, the effectiveness of surface conduction in providing leakage paths between the traces and the pads of an electronic device can be reduced, mitigated, or eliminated by depositing a selected material on the surface contributing to the leakage. The electronic device could be one of a number of devices including radiofrequency (RF) devices and film-bulk acoustic resonators (FBARs). In the case of a suspended membrane film-bulk acoustic resonator (FBAR), conduction can occur in the "swimming pool" or depression in the substrate over which the film-bulk acoustic resonator is formed. This parasitic conductive path in that depression could be created, for example, by the diffusion or deposition of phosphorous from a phosphorous silica glass sacrificial layer lightly doping the walls and surfaces of the depression. In representative embodiments, the materials deposited on the substrate reducing the leakage conduction could be various ceramics, dielectrics, metals, and other conductive materials. In particular, a dielectric material, such as silicon dioxide or silicon nitride, or a conductive or semiconductor material, such as aluminum nitride (AlN), molybdenum, or gold, could be used. In some representative embodiments, the material used can be attached to a fixed potential which could be ground potential.

In the following detailed description and in the several figures of the drawings, like elements are identified with like reference numerals.

FIG. 1 is a drawing of a block diagram of an electronic module 305. The electronic module 305 in FIG. 1 is shown as a block diagram of an electronic device 100 and an additional electronic component 300. The electronic device 100 could be a thin film bulk acoustic resonator 100 or any other appropriate electronic device 100 fabricated on a substrate 105. The additional electronic component 300 could also be additional thin film bulk acoustic resonator 100a or any other appropriate electronic device, component, or circuit fabricated on the same substrate 105. Further, the electronic module 305 could comprise a plurality of resonators 100 that together form a filter 305 constructed on the substrate 105 wherein the substrate 105 comprises one or more cavities 110 (see FIG. 2 and others) in the surface of the substrate 105. The electronic device 100 has a first electrode 120 and an additional electrode 310a. The additional electronic component 300 has additional electrodes 310b, 310c. Due to the fact that the electronic device 100 is fabricated on the substrate 105, a parasitic leakage path 360a having an impedance $Z_{P1}$ can exist between additional electrode 310a and the first electrode 120. The presence of this parasitic leakage path 360a enables leakage signals 365a to be transmitted between the additional electrode 310a and the first electrode 120. Also, due to the fact that the electronic device 100 and the additional electronic component 300 are fabricated on the same substrate 105, another parasitic leakage path 360b having an impedance $Z_{P2}$ can exist between additional electrode 310c and the first electrode 120. The presence of this parasitic leakage path 360b enables leakage signals 365b to be transmitted between the additional electrode 310c and the first electrode 120. Parasitic leakage paths 360 can also exist between other electrodes, for example electrode 310b, and the first electrode 120 providing enablement for other leakage signals 365 between the other electrodes and the first electrode 120. These leakage signals 365 are unwanted and are often detrimental to the operation of the electronic device 100 as well as to other electronic components 305 on the substrate 105. At least part of the paths 360 for these leakage signals 365 can occur via unintentional doping of the surface of the substrate 105 and the cavities 110 formed in the surface of the substrate 105.

Figure 2:
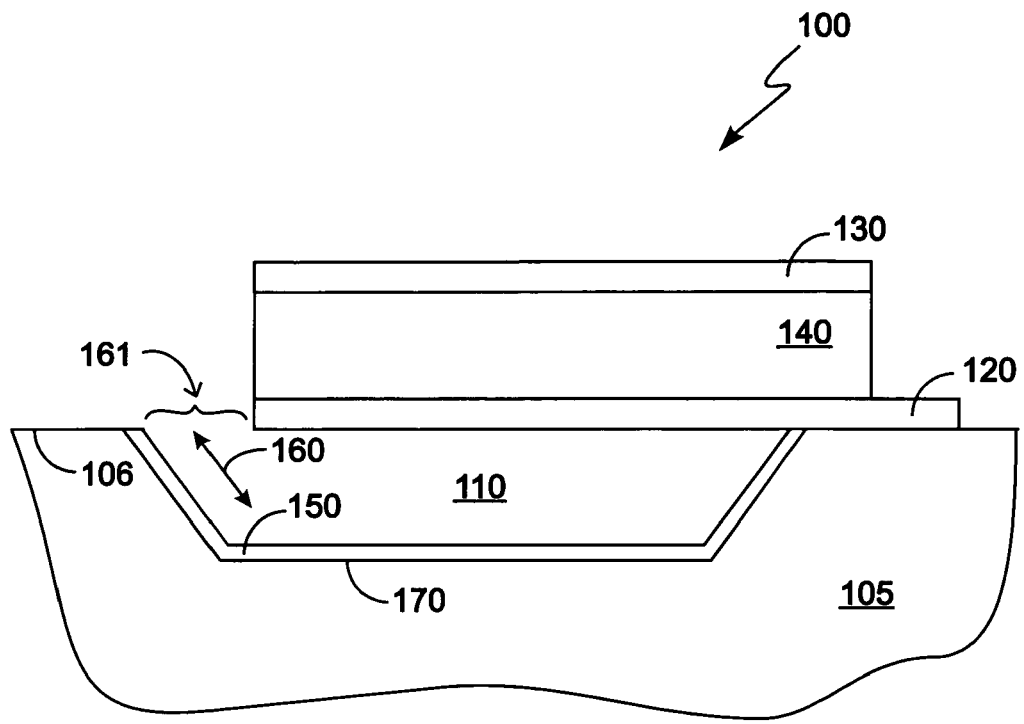
FIG. 2 is a drawing of an electronic device as described in various representative embodiments.

FIG. 2 is a drawing of an electronic device 100 as described in various representative embodiments. In the representative example of FIG. 2, the electronic device 100 is shown as thin film bulk acoustic resonator (FBAR) 100, also referred to herein as resonator 100. However, the electronic device 100 could be a radio-frequency (RF) filter 100, resonator 100, or other appropriate electronic device 100. In FIG. 2, the resonator 100 is shown in a side view and is fabricated using semiconductor processing compatible procedures. The resonator 100 is fabricated on a substrate 105 which could be, for example, a semiconductor 105 such as silicon 105, a semiconductor wafer 105 such as a silicon wafer 105, a ceramic substrate 105, or other appropriate substrate material. The resonator 100 is fabricated above a cavity 110 which isolates the vibrating part of the resonator 100 from the substrate 105 in order to reduce the vibrational energy that would otherwise be dissipated in the substrate 105. The cavity 110 is created on the top surface 106 of the substrate 105. The resonator 100 is fabricated above and bridges the cavity 110. The resonator 100 includes a first electrode 120 also referred to herein as a bottom electrode 120, a second electrode 130 also referred to herein as a top electrode 130, and a dielectric layer 140 which in FIG. 2 is piezoelectric layer 140. In the representative embodiment of FIG. 2, the piezoelectric layer 140 lies generally over at least a part of the bottom electrode 120, and the top electrode 130 lies generally over at least part of the piezoelectric layer 140.

Also shown in FIG. 2 is a coating layer 150, a release channel 160, and a release opening 161. The purpose of the release channel 160 and the release opening 161 will be explained in the discussion of FIG. 11. The coating layer 150 lies over at least part of the substrate 105 and lies generally between the substrate 105 and the cavity 110. The coating layer 150 can substantially insulate the resonator 100 from susceptibility to parasitic conducting paths that could otherwise occur at the substrate surface 170 in the region of cavity 110. Such parasitic conducting paths can be enabled by the diffusion or deposition of phosphorous from a phosphorous silica glass sacrificial layer lightly doping the walls and surfaces of the depression during processing.

In representative embodiments, the materials comprising the coating layer 150 which will reduce, mitigate, or eliminate the leakage conduction could be various ceramics, dielectrics, metals, and other conductive materials. In particular, a dielectric material, such as silicon dioxide or silicon nitride, or a conductive or semiconductor material, such as aluminum nitride, molybdenum, or gold, could be used.

Figure 3:
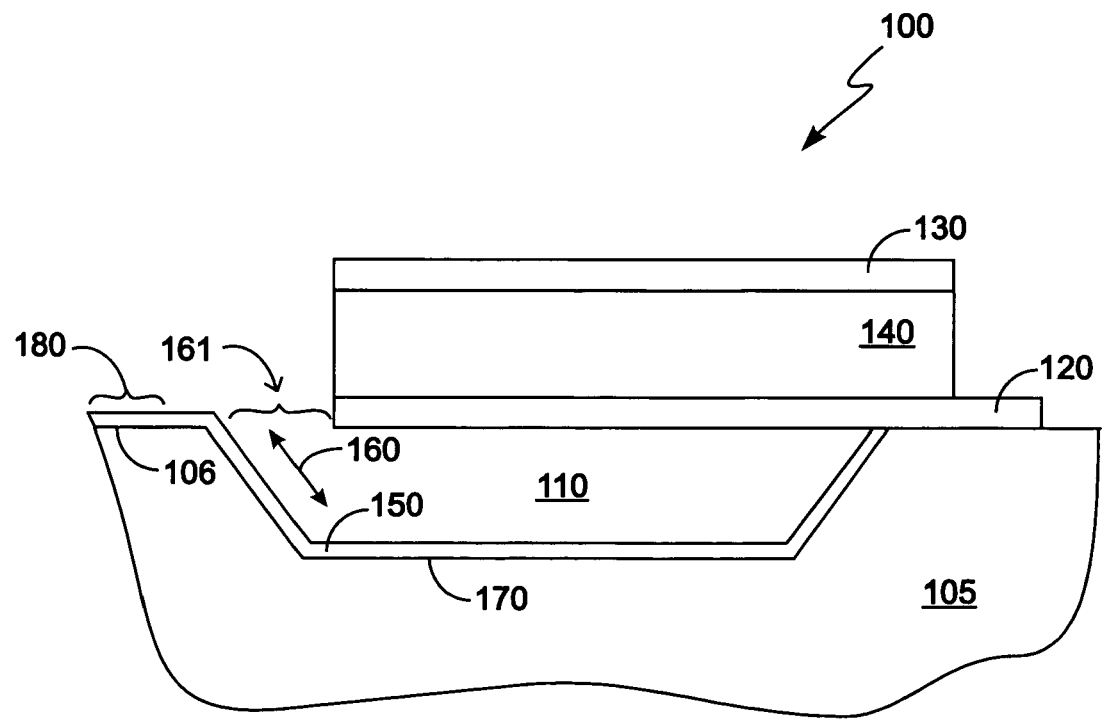
FIG. 3 is a drawing of another electronic device as described in various representative embodiments.

FIG. 3 is a drawing of another electronic device 100 as described in various representative embodiments. In the representative example of FIG. 3, the electronic device 100 is shown as thin film bulk acoustic resonator (FBAR) 100. In FIG. 3, the resonator 100 is shown in a side view and is fabricated using semiconductor processing compatible procedures. The resonator 100 is fabricated on the substrate 105 which could be, for example, a semiconductor 105 such as silicon 105, a semiconductor wafer 105 such as a silicon wafer 105, a ceramic substrate 105, or other appropriate substrate material. The resonator 100 is fabricated above the cavity 110 which isolates the vibrating part of the resonator 100 from the substrate 105 in order to reduce the vibrational energy that would otherwise be dissipated in the substrate 105. The cavity 110 is created on the top surface 106 of the substrate 105. The resonator 100 is fabricated above and bridges the cavity 110. The resonator 100 includes the bottom electrode 120, the top electrode 130, and the dielectric layer 140 which in FIG. 3 is piezoelectric layer 140. In the representative embodiment of FIG. 3, the piezoelectric layer 140 lies generally over at least a part of the bottom electrode 120, and the top electrode 130 lies generally over at least part of the piezoelectric layer 140.

Also shown in FIG. 3 is the coating layer 150, the release channel 160 and the release opening 161. Again, the purpose of the release channel 160 and the release opening 161 will be explained in the discussion which follows of FIG. 11. The coating layer 150 lies over at least part of the substrate 105 and lies generally between the substrate 105 and the cavity 110. The coating layer 150 can substantially insulate the resonator 100 from parasitic conducting paths that could otherwise occur at the substrate surface 170 in the region of the cavity 110. Such parasitic conducting paths can be enabled by the diffusion or deposition of phosphorous from a phosphorous silica glass sacrificial layer lightly doping the walls and surfaces of the depression during processing.

In representative embodiments, the materials comprising the coating layer 150 which will reduce, mitigate, or eliminate the leakage conduction could be various ceramics, dielectrics, metals, and other conductive materials. In particular, a dielectric material, such as silicon dioxide or silicon nitride, or a conductive or semiconductor material, such as aluminum nitride, molybdenum, or gold, could be used. In the representative embodiment of FIG. 3, the coating layer 150 extends beyond the region of the cavity 110. The coating layer 150 can thereby be connected to a fixed potential which could be ground. Such grounding could be effected via grounding contact 180, also referred to herein as contact 180.

In another representative embodiment, the electronic device 100 comprises a grounding contact 180 that is buried and does not make contact with the coating layer 150 through the release hole.

Figure 4:
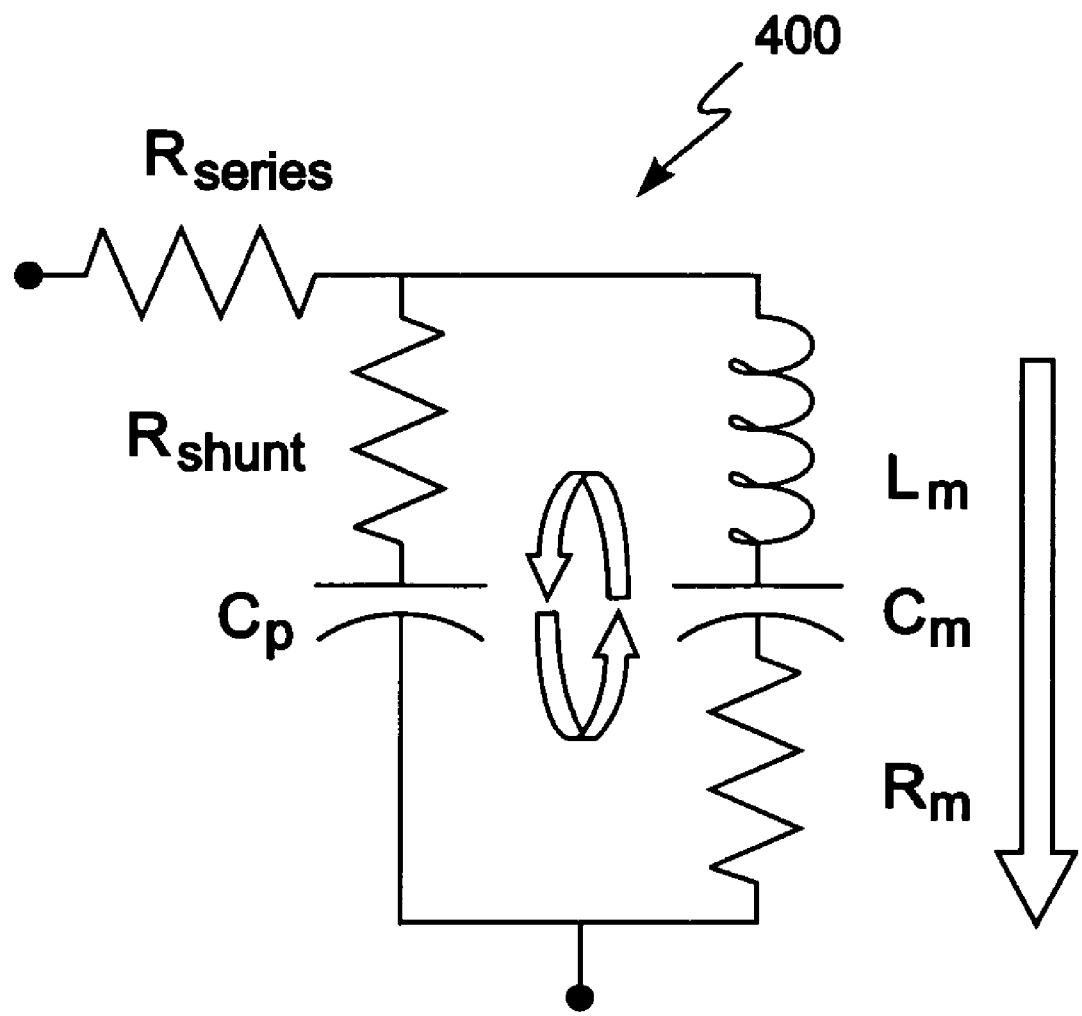
FIG. 4 is a drawing of an equivalent circuit for a thin film bulk acoustic resonator (FBAR).

FIG. 4 is a drawing of an equivalent circuit 400 for a thin film bulk acoustic resonator (FBAR). Thin film bulk acoustic resonators can be used in various representative embodiments herein due to the fact that their fabrication technology is compatible with that of integrated circuits and other semiconductor devices resulting in relative advantages in cost, reliability, and size over other technologies. FIG. 4 is a modified Butterworth-Van Dyke model of a thin film bulk acoustic resonator. From this equivalent circuit 400 it can be observed that the thin film bulk acoustic resonator has two resonant frequencies. The first resonant frequency is referred to as series resonant frequency $f_{SER}$ which results from the series combination of inductor $L_M$ and capacitor $C_M$. The second resonant frequency is referred to as parallel resonant frequency $f_{PAR}$ which results from the parallel combination of shunt capacitor $C_P$ and the above series combination of inductor $L_M$ and capacitor $C_M$. The parallel resonant frequency $f_{PAR}$ is also referred to as the anti-resonant frequency $f_{PAR}$. Resistor $R_{SERIES}$ and shunt resistor $R_{SHUNT}$ represent non-ideal, resistive components in the structure. With appropriate choice of parameters, combinations of thin film bulk acoustic resonators can be constructed to form a filter that has appropriate bandpass characteristics for a desired filter application.

Figure 5:
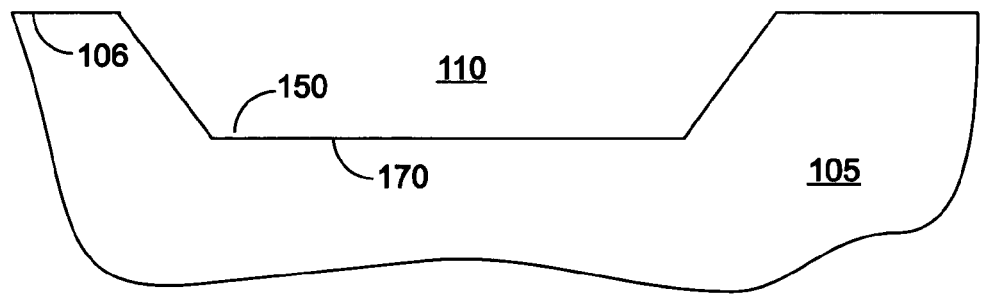
FIG. 5 is a drawing of a stage in the fabrication of the resonators of FIGS. 1 and 2.

FIG. 5 is a drawing of a stage in the fabrication of the resonators 100 of FIGS. 1 and 2. In FIG. 5, the structure is shown in a side view and is fabricated using semiconductor processing compatible procedures. In this example, the cavity 110 can be formed in the substrate 105 by the spinning of photoresist onto the substrate 105; the photoresist could be exposed through a photomask having the appropriate pattern; the photoresist could be subsequently developed to appropriately pattern the photoresist; the silicon substrate could be etched using the patterned photoresist as a mask and using well know etching technologies to appropriately pattern the cavity 110, and then the remaining photoresist could be removed.

Figure 6A:
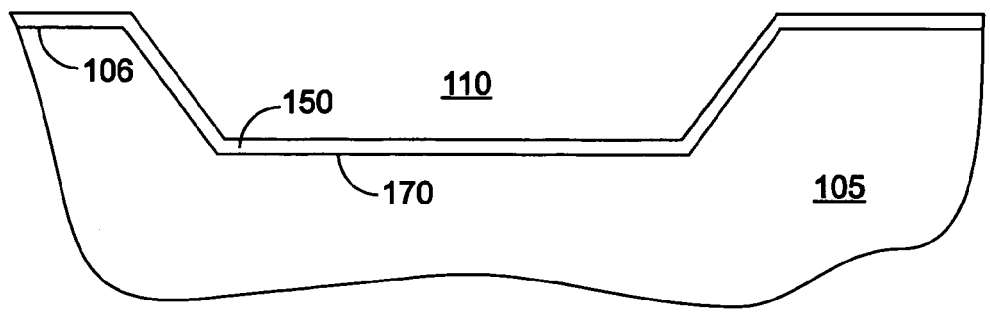
FIG. 6A is a drawing of another stage in the fabrication of the resonators of FIGS. 1 and 2.

FIG. 6A is a drawing of another stage in the fabrication of the resonators 100 of FIGS. 1 and 2. In FIG. 6A, the structure is shown in a side view and is fabricated using semiconductor processing compatible procedures. In this example, the cavity 110 created in FIG. 5 is coated with the coating layer 150. The coating layer 150 can be added using well known technologies such as chemical vapor deposition, evaporation, or sputtering. As an example, in a representative embodiment, a layer of a dielectric material, such as silicon dioxide or silicon nitride, or a conductive or semiconductor material, such as aluminum nitride, molybdenum, or gold, could be deposited or sputtered onto the top surface 106 including the substrate surface 170.

Figure 6B:
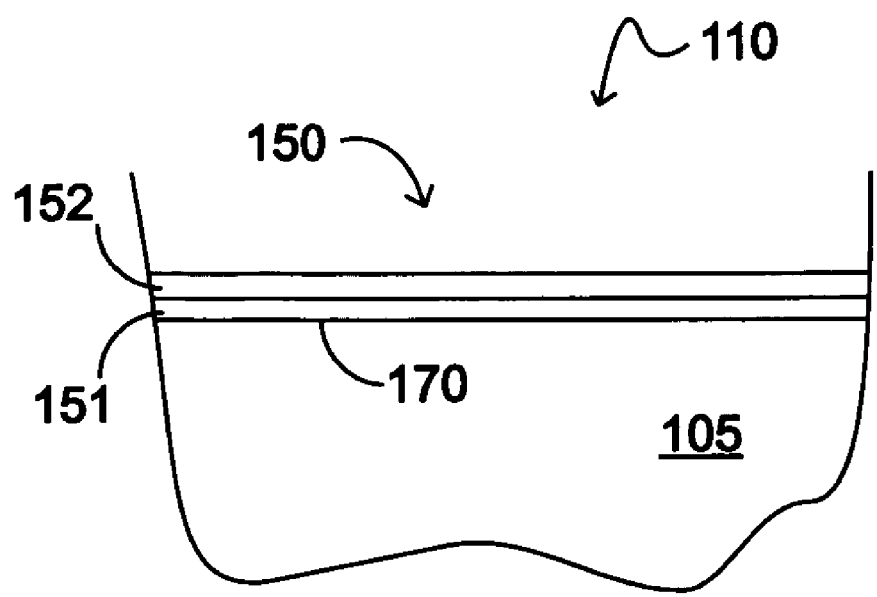
FIG. 6B is a drawing of a representative embodiment of the coating layer of FIGS. 1, 2, and 6A.

FIG. 6B is a drawing of a representative embodiment of the coating layer 150 of FIGS. 1, 2, and 6A. In FIG. 6B, the coating layer 150 comprises a first layer 151 overlaying at least part of the substrate surface 170 in the cavity 110 and a second layer 152 overlying the first layer 151. The first layer 151 could comprise silicon dioxide, silicon nitride, polysilicon, or other appropriate material, and the second layer 152 could comprise aluminum nitride or other appropriate material.

Figure 6C:
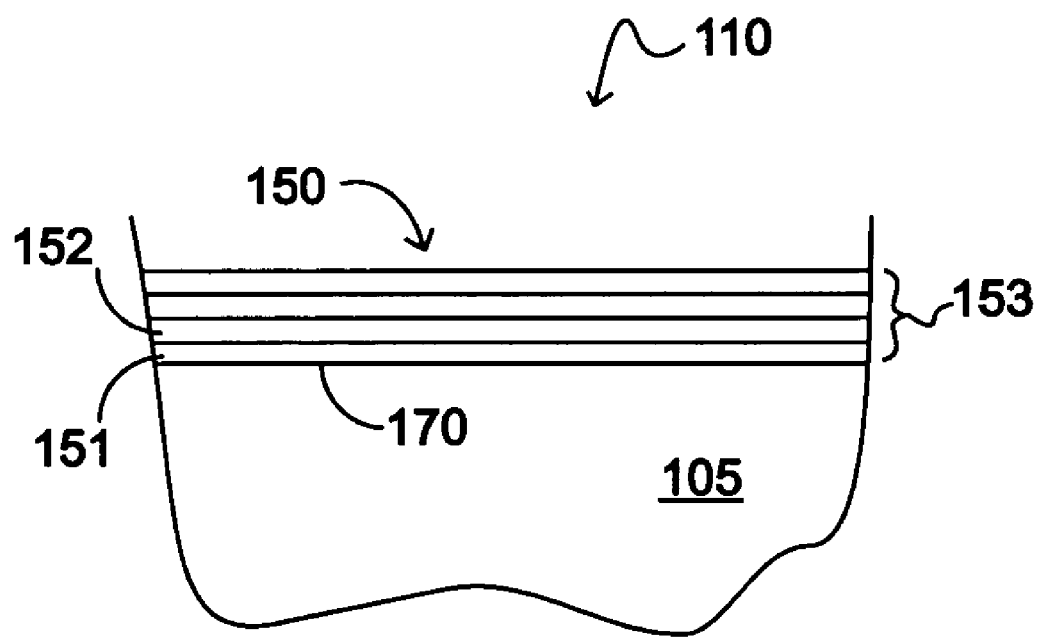
FIG. 6C is a drawing of another representative embodiment of the coating layer of FIGS. 1, 2, and 6A.

FIG. 6C is a drawing of another representative embodiment of the coating layer 150 of FIGS. 1, 2, and 6A. In FIG. 6C, the coating layer 150 comprises multiple other layers 153 which could comprise a first layer 151 overlaying at least part of the substrate surface 170 in the cavity 110 and a second layer 152 overlying the first layer 151. The first layer 151 could comprise silicon dioxide, silicon nitride, polysilicon, or other appropriate material, and the second layer 152 could comprise aluminum nitride or other appropriate material. Other layers 153 could overlie the second layer 152.

Figure 7:
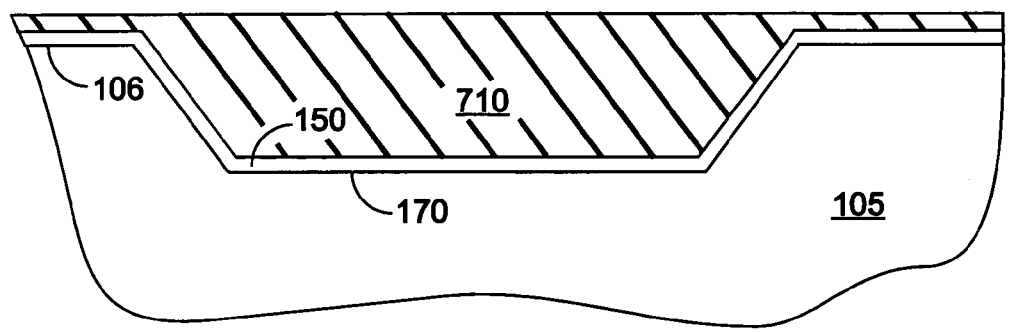
FIG. 7 is a drawing of still another stage in the fabrication of the resonators of FIGS. 1 and 2.

FIG. 7 is a drawing of still another stage in the fabrication of the resonators 100 of FIGS. 1 and 2. In FIG. 7, the structure is shown in a side view and is fabricated using semiconductor processing compatible procedures. In this example, the cavity 110 remaining after the addition of the coating layer 150 is filled with a sacrificial material 710 which also covers other parts of the top surface 106 of the substrate 105. The sacrificial material 710 can be removed later and could be, for example, a phosphorous silica glass material (8% phosphorous, 92% silicon dioxide) which is deposited by chemical vapor deposition.

Figure 8:
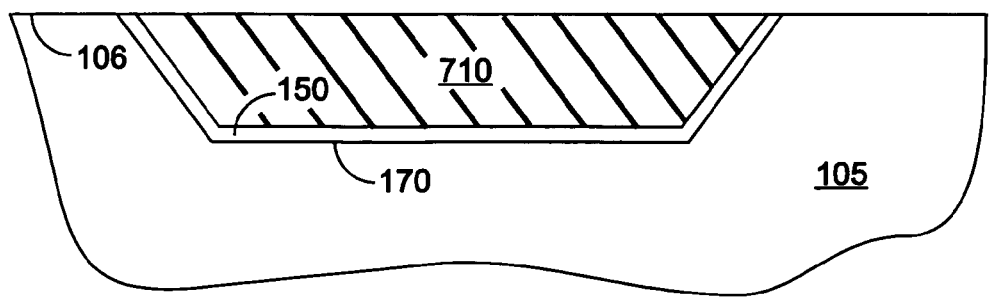
FIG. 8 is a drawing of still yet another stage in the fabrication of the resonators of FIGS. 1 and 2.

FIG. 8 is a drawing of still yet another stage in the fabrication of the resonators 100 of FIGS. 1 and 2. In FIG. 8, the structure is shown in a side view and is fabricated using semiconductor processing compatible procedures. In this example, the top surface 106 of the substrate 105 and the sacrificial material 710 filled cavity 110 are flattened and smoothed via one of a number of well known chemical-mechanical polishing (CMP) processes.

Figure 9:
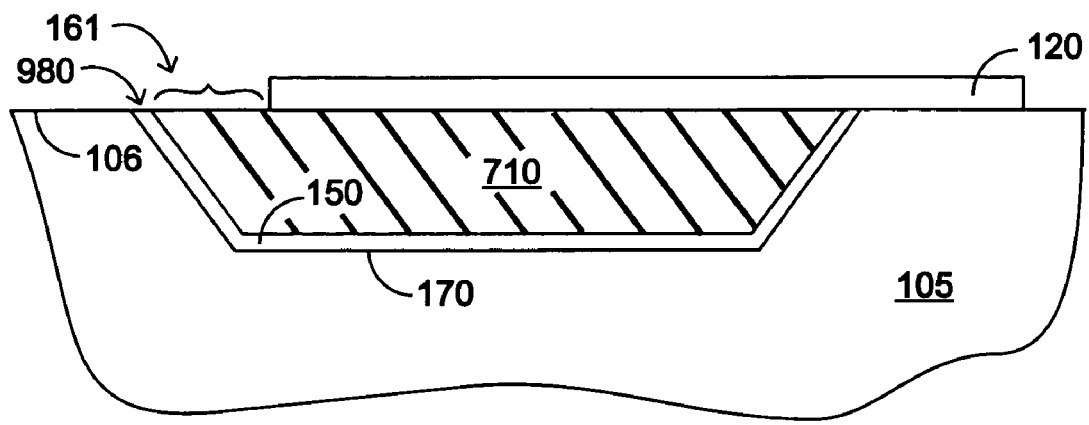
FIG. 9 is a drawing of a stage in the fabrication of the resonator of FIG. 2.

FIG. 9 is a drawing of a stage in the fabrication of the resonator 100 of FIG. 2. In FIG. 9, the structure is shown in a side view and is fabricated using semiconductor processing compatible procedures. In this example, the bottom electrode 120 is created above the sacrificial material 710 which along with the coating layer 150 now fills the cavity 110. The bottom electrode 120 can be fabricated using well known technologies such as deposition, photolithography, and etch. As an example, a layer of molybdenum could be deposited onto the wafer 105 and over the sacrificial material in the cavity 110 followed by the spinning of photoresist onto the wafer 105; the photoresist could be exposed through a photomask having the appropriate pattern; the photoresist could be subsequently developed to appropriately pattern the photoresist; the exposed material of the bottom electrode 120 could be etched to appropriately pattern the bottom electrode 120; and then the remaining photoresist could be removed. Though not shown in FIG. 9, the contact 180 could be created at the same time as the bottom electrode 120 by patterning the contact 180 to overlap the exposed edge of the coating layer 150 at location 980. A more reliable contact could be created by inserting an additional processing step to remove the sacrificial material 710 in the vicinity of the release opening 161 exposing that part of the coating layer 150.

Figure 10:
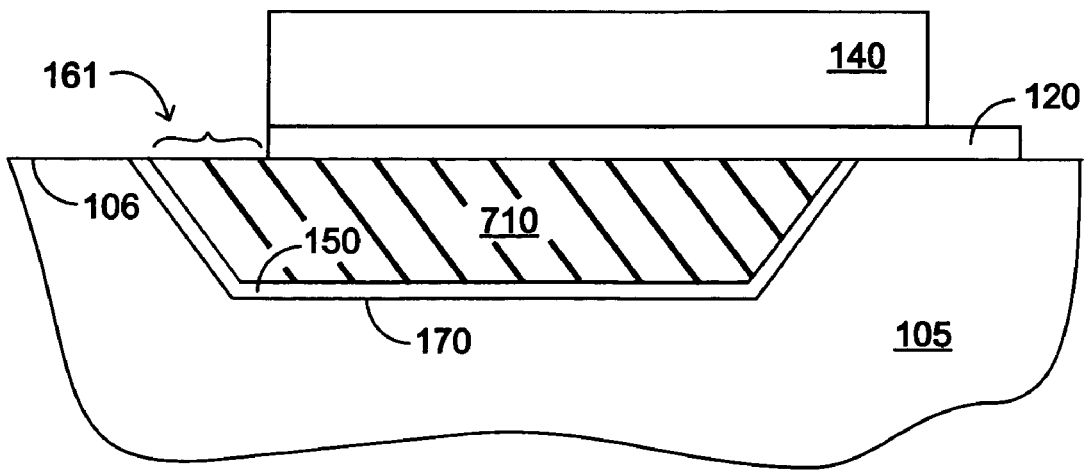
FIG. 10 is a drawing of another stage in the fabrication of the resonator of FIG. 2.

FIG. 10 is a drawing of another stage in the fabrication of the resonator 100 of FIG. 2. In FIG. 10, the structure is shown in a side view and is fabricated using semiconductor processing compatible procedures. In this example, the piezoelectric layer 140 is created above the bottom electrode 120. The piezoelectric layer 140 can be fabricated using well known technologies such as deposition, photolithography, and etch. As an example, a layer of aluminum nitride could be deposited onto the wafer 105 and over the bottom electrode 120 followed by the spinning of photoresist onto the wafer 105; the photoresist could be exposed through a photomask having the appropriate pattern; the photoresist could be subsequently developed to appropriately pattern the photoresist; the exposed material of the piezoelectric layer 140 could be etched to appropriately pattern the piezoelectric layer 140; and then the remaining photoresist could be removed.

Figure 11:
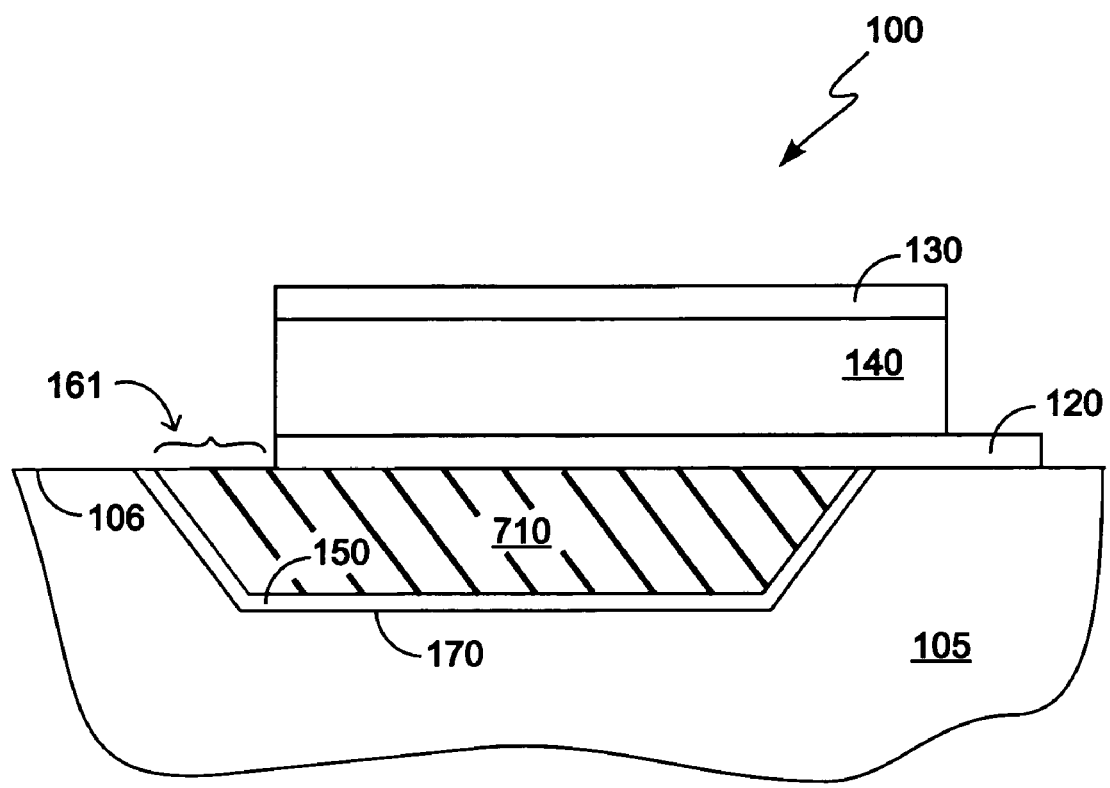
FIG. 11 is a drawing of yet another stage in the fabrication of the resonator of FIG. 2.

FIG. 11 is a drawing of yet another stage in the fabrication of the resonator 100 of FIG. 2. In FIG. 11, the structure is shown in a side view and is fabricated using semiconductor processing compatible procedures. In this example, the top electrode 130 is created above the piezoelectric layer 140. The top electrode 130 can be fabricated using well known technologies such as deposition, photolithography, and etch. As an example a layer of molybdenum could be deposited onto the wafer 105 and over the piezoelectric layer 140 followed by the spinning of photoresist onto the wafer 105; the photoresist could be exposed through a photomask having the appropriate pattern; the photoresist could be subsequently developed to appropriately pattern the photoresist; the exposed material of the top electrode 130 could be etched to appropriately pattern the top electrode 130; and then the remaining photoresist could be removed.

The sacrificial material 710 previously deposed in the cavity 110 is then removed through the release channel 160 via the release opening 161 to result in the resonator 100 shown in FIG. 2. The location of the release channel 160 in FIG. 11 and other applicable figures can be inferred from its location in FIGS. 1 and 2. Should the sacrificial material 710 be a glass, hydrofluoric acid can be used to etch it from the cavity 110.

Figure 12:
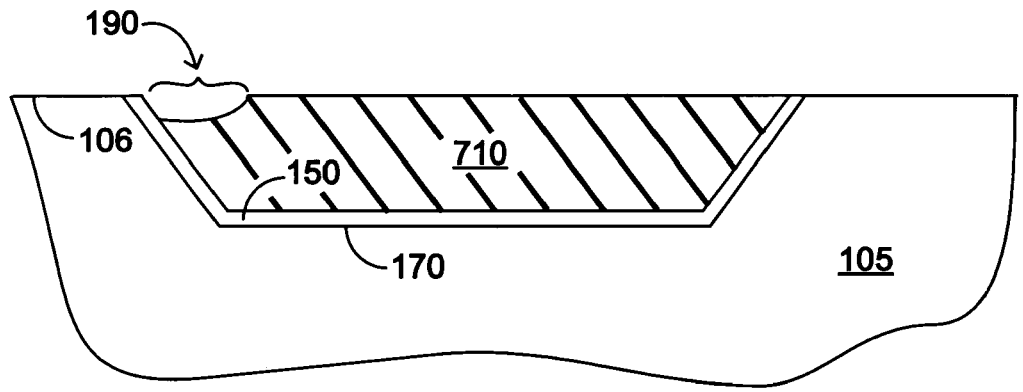
FIG. 12 is a drawing of a stage in the fabrication of the resonator of FIG. 3.

FIG. 12 is a drawing of a stage in the fabrication of the resonator 100 of FIG. 3. In FIG. 12, the structure is shown in a side view and is fabricated using semiconductor processing compatible procedures. In this example, a contact opening 190 is created in a part of the sacrificial material filling the cavity 110. The contact opening 190 is opened down to part of the coating layer 150. The contact opening 190 can be fabricated using well known technologies such as photolithography and etch. As an example, photoresist can be spun onto the wafer 105; the photoresist could be exposed through a photomask having the appropriate pattern; the photoresist could be subsequently developed to appropriately pattern the photoresist; part of the exposed sacrificial material 710 of the cavity 110 could be etched to appropriately create the contact opening 190; and then the remaining photoresist could be removed. If the sacrificial material 710 is a phosphorous silica glass material, it can be removed by a timed etch with hydrofluoric acid.

In another representative embodiment, the material for the contact 180 is deposited, patterned, and etched prior to deposition of the phosphorous silica glass sacrificial layer 710. Then the phosphorous silica glass sacrificial layer 710 is then deposited and the chemical-mechanical polishing process is performed.

In still another representative embodiment, The material for the contact 180 could be deposited first followed by deposition of the phosphorous silica glass sacrificial layer 710 and chemical-mechanical polishing of the phosphorous silica glass sacrificial layer 710. Then the contact 180 is patterned and etched. The material for process. Alternatively, an etch stop layer could be added on top of the contact 180 layer. In some embodiments, the material for the contact 180 could be the same material as that of the coating layer 150. In still other representative embodiments, the contact 180 could be formed by a lift-off process.

Figure 13:
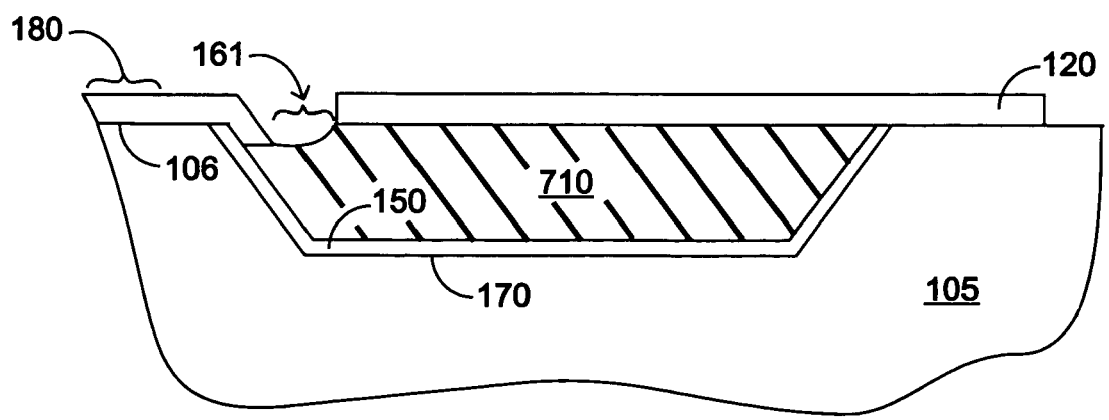
FIG. 13 is a drawing of another stage in the fabrication of the resonator of FIG. 3.

FIG. 13 is a drawing of another stage in the fabrication of the resonator 100 of FIG. 3. In FIG. 13, the structure is shown in a side view and is fabricated using semiconductor processing compatible procedures. In this example, the bottom electrode 120 is created above the sacrificial material in the cavity 110, and the contact 180 is created such that it contacts the coating layer 150 through the contact opening 190. For this representative embodiment, the grounding contact 180 is a conductive material. The bottom electrode 120 and the grounding contact 180 can be fabricated using well known technologies such as deposition, photolithography, and etch. As an example, a layer of molybdenum could be deposited onto the wafer 105 and over the sacrificial material 710 in the cavity 110 followed by the spinning of photoresist onto the wafer 105; the photoresist could be exposed through a photomask having the appropriate pattern; the photoresist could be subsequently developed to appropriately pattern the photoresist; the exposed material of the bottom electrode 120 and of the grounding contact 180 could be etched to appropriately pattern the bottom electrode 120 and the grounding contact 180; and then the remaining photoresist could be removed.

Figure 14:
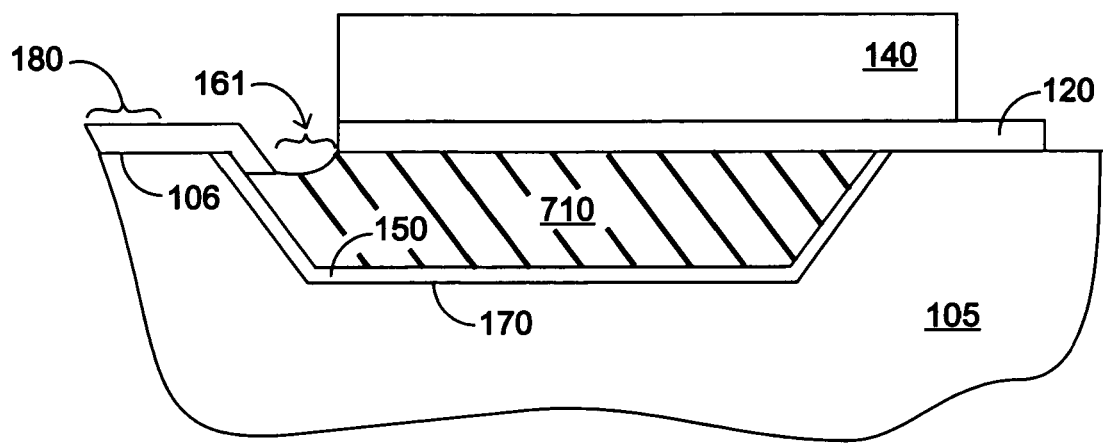
FIG. 14 is a drawing of yet another stage in the fabrication of the resonator of FIG. 3.

FIG. 14 is a drawing of yet another stage in the fabrication of the resonator 100 of FIG. 3. In FIG. 14, the structure is shown in a side view and is fabricated using semiconductor processing compatible procedures. In this example, the piezoelectric layer 140 is created above the bottom electrode 120. The piezoelectric layer 140 can be fabricated using well known technologies such as deposition, photolithography, and etch. As an example, a layer of aluminum nitride could be deposited onto the wafer 105 and over the bottom electrode 120 followed by the spinning of photoresist onto the wafer 105; the photoresist could be exposed through a photomask having the appropriate pattern; the photoresist could be subsequently developed to appropriately pattern the photoresist; the exposed material of the piezoelectric layer 140 could be etched to appropriately pattern the piezoelectric layer 140; and then the remaining photoresist could be removed.

Figure 15:
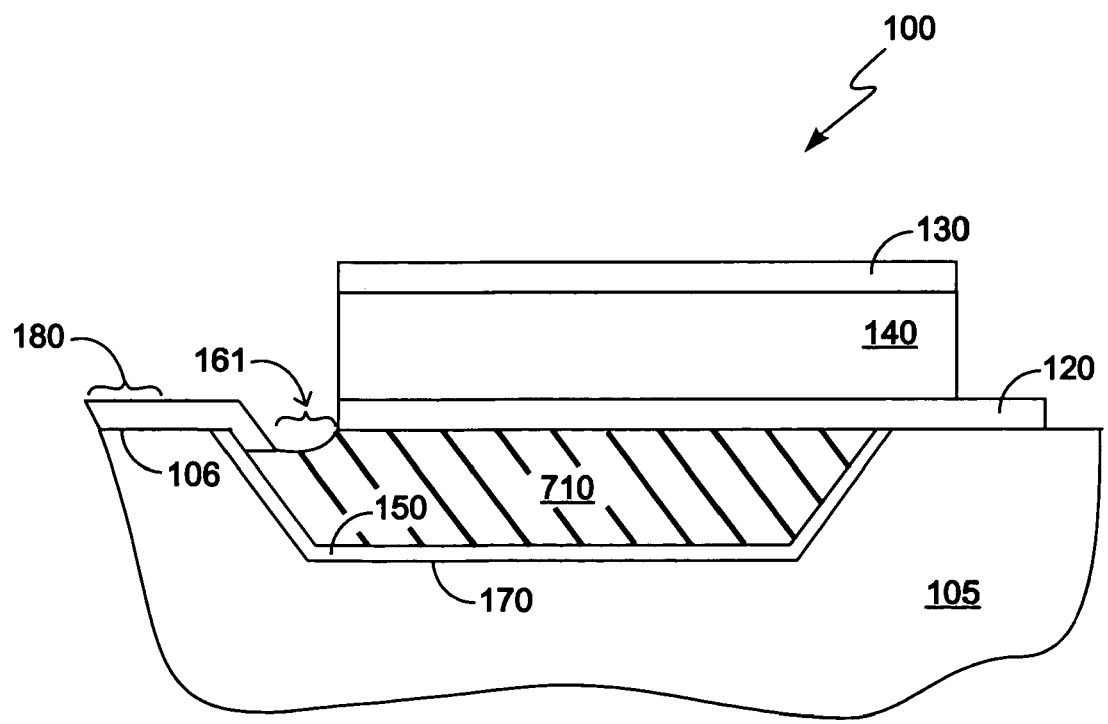
FIG. 15 is a drawing of still another stage in the fabrication of the resonator of FIG. 3.

FIG. 15 is a drawing of still another stage in the fabrication of the resonator 100 of FIG. 3. In FIG. 15, the structure is shown in a side view and is fabricated using semiconductor processing compatible procedures. In this example, the top electrode 130 is created above the piezoelectric layer 140. The top electrode 130 can be fabricated using well known technologies such as deposition, photolithography, and etch. As an example a layer of molybdenum could be deposited onto the wafer 105 and over the piezoelectric layer 140 followed by the spinning of photoresist onto the wafer 105; the photoresist could be exposed through a photomask having the appropriate pattern; the photoresist could be subsequently developed to appropriately pattern the photoresist; the exposed material of the top electrode 130 could be etched to appropriately pattern the top electrode 130; and then the remaining photoresist could be removed.

The sacrificial material 710 previously deposed in the cavity 110 is then removed to result in the resonator 100 shown in FIG. 3. Should the sacrificial material 710 be a glass, hydrofluoric acid can be used to etch it from the cavity 110.

Figure 16:
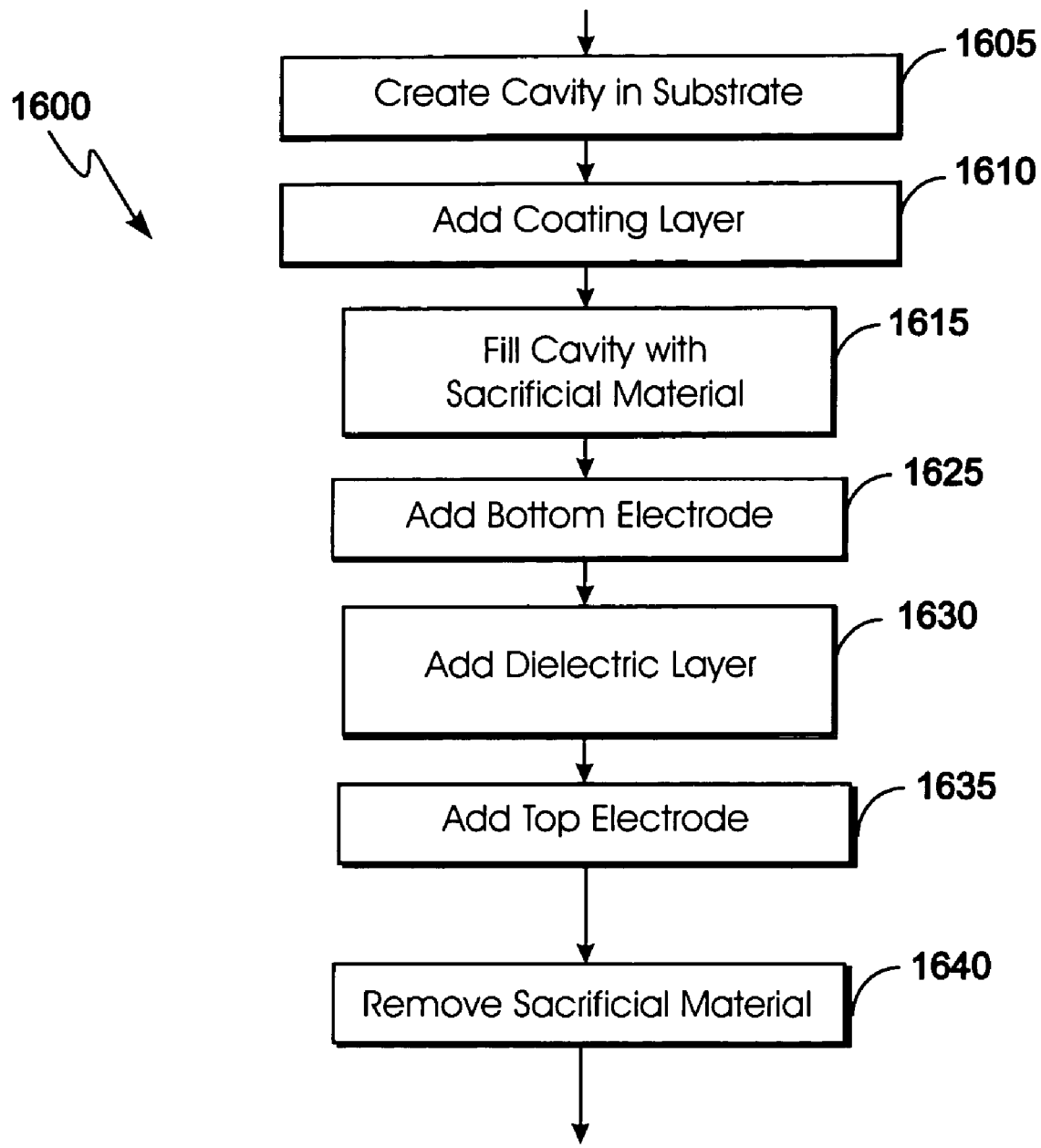
FIG. 16 is a flow chart of a method for fabricating the resonator of FIG. 2.

FIG. 16 is a flow chart of a method 1600 for fabricating the resonator 100 of FIG. 2. In block 1605, the cavity 110 is created in the substrate 105. The cavity 110 can be fabricated using well known technologies such as photolithography and etch. As an example, photoresist could be spun onto the wafer 105; the photoresist could be exposed through a photomask having the appropriate pattern; the photoresist could be subsequently developed to appropriately pattern the photoresist; the silicon substrate could be etched using the patterned photoresist as a mask to appropriately pattern the cavity 110; and then the remaining photoresist could be removed from the wafer 105. Block 1605 then transfers control to block 1610.

In block 1610, the cavity 110 created in block 1605 is coated with the coating layer 150. The coating layer 150 can be added using well known technologies such as chemical vapor deposition or sputtering, photolithography, and etch. As an example, in a representative embodiment, a layer of a dielectric material, such as silicon dioxide or silicon nitride, or a conductive or semiconductor material, such as aluminum nitride, molybdenum, or gold, could be deposited or sputtered onto the wafer 105 and over the cavity 110 followed by the spinning of photoresist onto the wafer 105; the photoresist could be exposed through a photomask having the appropriate pattern; the photoresist could be subsequently developed to appropriately pattern the photoresist; the exposed material of the coating layer 150 could be etched to appropriately pattern the coating layer 150; and then the remaining photoresist could be removed. Alternatively, at this stage the coating layer 150 may remain un-patterned with unneeded portions of the coating layer 150 removed in block 1615. Block 1610 then transfers control to block 1615.

In block 1615, the remaining cavity 110 above the coating layer 150 is filled with a sacrificial material 710. The sacrificial material 710 can be removed later and could be a phosphorous silica glass material comprising approximately 8% phosphorous and approximately 92% silicon dioxide. The cavity 110 can be filled with the sacrificial material 710 using well known technologies such as oxide deposition with subsequent surface polishing and etching to form a smooth surface. As an example, a layer of phosphorous silica glass could be deposited onto the wafer 105 followed by a mechanical polishing and chemical etching of the wafer surface to flatten and smooth the surface leaving the phosphorous silica glass in the remaining cavity 110 above the coating layer 150. As indicated in the discussion of block 1610 unneeded portions of the coating layer 150 (those portions outside the cavity 110) can be removed by the chemical-mechanical polishing process of block 1615. Block 1615 then transfers control to block 1625.

In block 1625, the bottom electrode 120 is created above the sacrificial material 710 in the cavity 110. The bottom electrode 120 can be fabricated using well known technologies such as deposition, photolithography, and etch. As an example, a layer of molybdenum could be deposited onto the wafer 105 and over the sacrificial material 710 in the cavity 110 followed by the spinning of photoresist onto the wafer 105; the photoresist could be exposed through a photomask having the appropriate pattern; the photoresist could be subsequently developed to appropriately pattern the photoresist; the exposed material of the bottom electrode 120 could be etched to appropriately pattern the bottom electrode 120; and then the remaining photoresist could be removed. Block 1625 then transfers control to block 1630.

In block 1630, the dielectric layer 140 is created above the bottom electrode 120. In this example, the piezoelectric layer 140 can be fabricated using well known technologies such as deposition, photolithography, and etch. As an example, a layer of aluminum nitride could be deposited onto the wafer 105 and over the bottom electrode 120 followed by the spinning of photoresist onto the wafer 105; the photoresist could be exposed through a photomask having the appropriate pattern; the photoresist could be subsequently developed to appropriately pattern the photoresist; the exposed material of the piezoelectric layer 140 could be etched to appropriately pattern the piezoelectric layer 140; and then the remaining photoresist could be removed. Block 1630 then transfers control to block 1635.

In block 1635, the top electrode 130 is created above the piezoelectric layer 140. The top electrode 130 can be fabricated using well known technologies such as deposition, photolithography, and etch. As an example a layer of molybdenum could be deposited onto the wafer 105 and over the piezoelectric layer 140 followed by the spinning of photoresist onto the wafer 105; the photoresist could be exposed through a photomask having the appropriate pattern; the photoresist could be subsequently developed to appropriately pattern the photoresist; the exposed material of the top electrode 130 could be etched to appropriately pattern the top electrode 130; and then the remaining photoresist could be removed. Block 1035 then transfers control to block 1640.

In block 1640, the sacrificial material 710 previously deposed in the cavity 110 is removed. Should the sacrificial material 710 be a glass, hydrofluoric acid can be used to etch it from the cavity 110. Block 1640 then terminates the process.

As will be known to one skilled in the art, in other representative embodiments, various changes can be made to the above described processes to effect similar structures to those just described.

Figure 17:
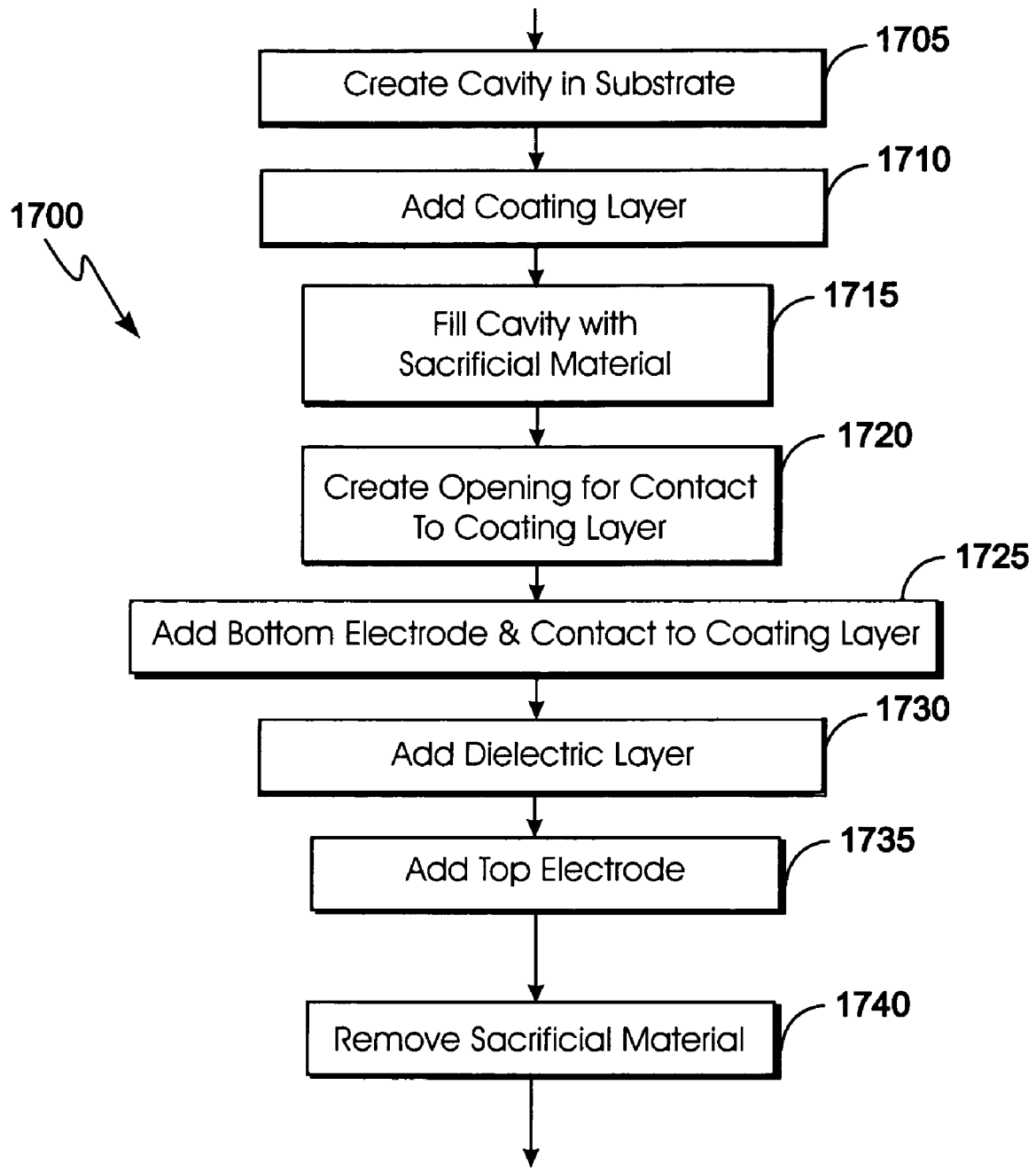
FIG. 17 is a flow chart of a method for fabricating the resonator of FIG. 3.

FIG. 17 is a flow chart of a method 1700 for fabricating the resonator 100 of FIG. 3. In block 1705, the cavity 110 is created in the substrate 105. The cavity 110 can be fabricated using well known technologies such as photolithography and etch. As an example, photoresist can be spun onto the wafer 105; the photoresist could be exposed through a photomask having the appropriate pattern; the photoresist could be subsequently developed to appropriately pattern the photoresist; the silicon substrate could be etched using the patterned photoresist as a mask to appropriately create the cavity 110; and then the remaining photoresist could be removed from the wafer 105. Block 1705 then transfers control to block 1710.

In block 1710, the cavity 110 created in block 1705 is coated with the coating layer 150. The coating layer 150 can be added using well known technologies such as chemical vapor deposition or sputtering, photolithography, and etch. As an example, in a representative embodiment, a layer of a dielectric material, such as silicon dioxide or silicon nitride, or a conductive or semiconductor material, such as aluminum nitride, molybdenum, or gold, could be deposited or sputtered onto the wafer 105 and over the sacrificial material in the cavity 110 followed by the spinning of photoresist onto the wafer 105; the photoresist could be exposed through a photomask having the appropriate pattern; the photoresist could be subsequently developed to appropriately pattern the photoresist; the exposed material of the coating layer 150 could be etched to appropriately pattern the coating layer 150; and then the remaining photoresist could be removed. Alternatively, at this stage the coating layer 150 may remain un-patterned with unneeded portions of the coating layer 150 removed in block 1715. Block 1710 then transfers control to block 1715.

In block 1715, the remaining cavity 110 above the coating layer 150 is filled with a sacrificial material 710. The sacrificial material 710 can be removed later and could be a phosphorous silica glass material comprising approximately 8% phosphorous and approximately 92% silicon dioxide. The cavity 110 can be filled with the sacrificial material 710 using well known technologies such as oxide deposition with subsequent surface polishing and etching to form a smooth surface. As an example, a layer of phosphorous silica glass could be deposited onto the wafer 105 followed by a mechanical polishing and chemical etching of the wafer surface to flatten and smooth the surface leaving the phosphorous silica glass in the remaining cavity 110 above the coating layer 150. As indicated in the discussion of block 1710 unneeded portions of the coating layer 150 (those portions outside the cavity 110) can be removed by the chemical-mechanical polishing process of block 1715. Block 1715 then transfers control to block 1720.

In block 1720, the contact opening 190 is created through a part of the sacrificial material 710 in the cavity 110. The contact opening 190 can be fabricated using well known technologies such as photolithography and etch. As an example, a layer of photoresist could be spun onto the wafer 105 and over the sacrificial material 710 in the cavity 110; the photoresist could be exposed through a photomask having the appropriate pattern; the photoresist could be subsequently developed to appropriately pattern the photoresist; the exposed sacrificial material 710 in the cavity 110 could be etched down to the coating layer 150; and then the remaining photoresist could be removed. Block 1720 then transfers control to block 1725.

In block 1725, the bottom electrode 120 is created above the sacrificial material 710 in the cavity 110. The bottom electrode 120 can be fabricated using well known technologies such as deposition, photolithography, and etch. As an example, a layer of molybdenum could be deposited onto the wafer 105 and over the sacrificial material 710 in the cavity 110 followed by the spinning of photoresist onto the wafer 105; the photoresist could be exposed through a photomask having the appropriate pattern; the photoresist could be subsequently developed to appropriately pattern the photoresist; the exposed material of the bottom electrode 120 could be etched to appropriately pattern the bottom electrode 120; and then the remaining photoresist could be removed. Block 1725 then transfers control to block 1730. The contact 180 to the coating layer 150 can be formed simultaneously or separately using a separate deposition, pattern, and etch or a pattern, deposition, and lift-off process. In another representative embodiment, the electronic device 100 comprises a grounding contact 180 that is buried and does not make contact with the coating layer 150 through the release hole.

In block 1730, the dielectric layer 140 is created above the bottom electrode 120. In this example, the piezoelectric layer 140 can be fabricated using well known technologies such as deposition, photolithography, and etch. As an example, a layer of aluminum nitride could be deposited onto the wafer 105 and over the bottom electrode 120 followed by the spinning of photoresist onto the wafer 105; the photoresist could be exposed through a photomask having the appropriate pattern; the photoresist could be subsequently developed to appropriately pattern the photoresist; the exposed material of the piezoelectric layer 140 could be etched to appropriately pattern the piezoelectric layer 140; and then the remaining photoresist could be removed. Block 1730 then transfers control to block 1735.

In block 1735, the top electrode 130 is created above the piezoelectric layer 140. The top electrode 130 can be fabricated using well known technologies such as deposition, photolithography, and etch. As an example a layer of molybdenum could be deposited onto the wafer 105 and over the piezoelectric layer 140 followed by the spinning of photoresist onto the wafer 105; the photoresist could be exposed through a photomask having the appropriate pattern; the photoresist could be subsequently developed to appropriately pattern the photoresist; the exposed material of the top electrode 130 could be etched to appropriately pattern the top electrode 130; and then the remaining photoresist could be removed. Block 1035 then transfers control to block 1740.

In block 1740, the sacrificial material 710 previously deposited in the cavity 110 is removed. Should the sacrificial material 710 be a glass, hydrofluoric acid can be used to etch it from the cavity 110. Block 1740 then terminates the process.

As will be known to one skilled in the art, in other representative embodiments, various changes can be made to the above described processes to effect similar structures to those just described. Such changes can include the addition of a passivation layer on the top surface 106 of the wafer 105 which could be, for example, silicon dioxide.

In the representative embodiments of the resonators 100 of FIGS. 1 and 2 the bottom electrode 120, the piezoelectric layer 140, and the top electrode 130 are shown as shortened or truncated over the cavity 110 so that release openings 161 are not covered by these layers which enables making contact to the coating layer 150 and in removing the sacrificial material from the cavity 110. However, it may be necessary to leave only a small part of the upper surface of the sacrificial material 710 as the release opening 161 for the release channel 160 such that a substantial part of the perimeter of the bottom electrode 120 can be supported by the top surface 106 of the substrate 105. Also, interconnections to the bottom electrode 120, the grounding contact 180 if present, and the top electrode 130, as well as various passivation layers are not shown.

In various representative embodiments, the coating layer 150, the grounding contact 180, the bottom electrode 120, and the top electrode 130 may be formed by implanting various materials. In other representative embodiments, a buried metallization may be formed underneath the wafer surface, followed by deposition of an etch stop layer. Contact to these buried metal layers may be made through vias and via metallization.

In various representative embodiments, the bottom electrode 120 may not make good electrical contact with the substrate 105 as indicated in FIGS. 1-2, 9-11, and 13-15 and associated discussions but may instead be separated from the substrate 105 by an insulating layer which could be, for example, a dielectric layer situated between the bottom electrode 120 and the substrate 105. However, in such embodiments, the bottom electrode 120 may still be coupled electrically to the substrate 105 via capacitive coupling or inductive coupling.

As disclosed herein, the effectiveness of conductive, leakage paths between an electronic device 100 and other additional electronic components 300 on a semiconductor substrate 105 or other applicable substrate 105 material can be reduced, mitigated, or eliminated by depositing a selected material that reduces the electrical conduction characteristics in the vicinity of the surface of the cavity 110. The electronic device 100 could be one of a number of devices including radio-frequency devices and film bulk acoustic resonators.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A thin film bulk acoustic resonator, comprising: a first electrode, wherein the thin film bulk acoustic resonator is fabricated on a substrate and wherein the substrate has a cavity created in a top surface of the substrate; a piezoelectric layer overlying at least part of the first electrode; a second electrode overlying at least part of the piezoelectric layer; a coating layer comprising multiple layers, comprising: a first layer comprising silicon dioxide that overlays at least a part of the substrate surface in the cavity and a second layer comprising aluminum nitride that overlays at least part of the first layer, wherein the coating layer coats at least part of a substrate surface in the cavity.

2. The thin film bulk acoustic resonator as recited in claim 1, wherein the presence of the coating layer results in a mitigation of at least one parasitic leakage path between the first electrode and an additional electrode fabricated on the substrate.

3. The thin film bulk acoustic resonator as recited in claim 1, wherein the cavity is connected by at least one channel to at least one release opening wherein the at least one release opening enables removal of a sacrificial material, and wherein the coating layer covers at least part of the walls of the at least one channel.

4. The thin film bulk acoustic resonator as recited in claim 1, wherein the coating layer material is selected from the group of materials consisting of a dielectric material, a semiconductor material, a conductive material, a metal, a ceramic, an implanted material, silicon dioxide, silicon nitride, aluminum nitride, molybdenum, and gold.

5. The thin film bulk acoustic resonator as recited in claim 1, wherein the coating layer is attachable to a fixed electrical potential.

6. The thin film bulk acoustic resonator as recited in claim 1, wherein the substrate is selected from the group consisting of a semiconductor, a semiconductor wafer, silicon, a silicon wafer, and a ceramic substrate.

7. The thin film bulk acoustic resonator as recited in claim 1, wherein the coating layer further overlies at least a part of the top surface of the substrate.

* * * * *